United States Patent [19]

Hammond

[11] Patent Number: 4,859,980
[45] Date of Patent: Aug. 22, 1989

[54] APPARATUS AND METHOD FOR PROVIDING IMPROVED RESISTIVE RATIO STABILITY OF A RESISTIVE DIVIDER NETWORK

[75] Inventor: Robert W. Hammond, Edmonds, Wash.

[73] Assignee: John Fluke Mfg. Co., Inc., Everett, Wash.

[21] Appl. No.: 205,965

[22] Filed: Jun. 13, 1988

Related U.S. Application Data

[63] Continuation of Ser. No. 26,156, Mar. 16, 1987, Pat. No. 4,792,782.

[51] Int. Cl.[4] .............................................. H01C 1/012
[52] U.S. Cl. .................................. 338/308; 338/295; 338/320
[58] Field of Search .............. 338/308, 309, 295, 320, 338/22 R, 25; 29/610.1, 612

[56] References Cited

U.S. PATENT DOCUMENTS 4,332,081  6/1982  Francis ........................... 338/308 X Primary Examiner—C. L. Albritton
Attorney, Agent, or Firm—Mikio Ishimaru; Stephen A. Becker

[57] ABSTRACT

A resistor divider network is disclosed having two or more thin or thick film resistive elements deposited on a substrate. Each of the resistive elements is divided into a number of resistive subelements which are interleaved so as to improve the temperature coefficient of ratio (TCR tracking) and improve the thermal coupling which greatly improves the ratio constancy over a wide range of input voltage. There are an odd total number of resistive subelements, the subelements of each main element having equal resistances.

9 Claims, 1 Drawing Sheet

APPARATUS AND METHOD FOR PROVIDING IMPROVED RESISTIVE RATIO STABILITY OF A RESISTIVE DIVIDER NETWORK

This application is a continuation of application serial number 07/026,156, filed Mar. 16, 1987, patent number 4,792,782.

FIELD OF THE INVENTION

The present invention relates generally to thin and thick film resistor networks and in particular to improving the resistive ratio stability of resistor divider networks.

BACKGROUND OF THE INVENTION

High precision, electronic measurement and test require resistive divider networks having high resistive ratio stability. This means that the ratios of the resistor values should remain as stable as possible when the network is subjected to environmental and operational influences such as temperature and voltage changes.

In the past, high precision instruments had to use very expensive, physically large, wire-wound resistors in their divider networks. Film resistor networks, while satisfactory for less accurate instruments, were generally incapable of the required ratio stability unless they were specially selected, which made them very expensive. Ratio stability on the order of 0.5 parts per million (ppm) per degree centigrade (ppm/°C.) for ambient temperature changes and 2 ppm for input voltage changes of 1000 volts are involved here.

Ratio stability is affected by three primary factors:

1. the difference in the temperature coefficient of resistance (TCR) of the resistors making up the divider (also known as TCR tracking);

2. the difference in the voltage coefficient of resistance (VCR) of the resistors (also known as VCR tracking); and 3. the difference in the temperatures of the resistors.

In considering the affect of factor 1, TCR is defined as:

$$TCR = \frac{R_2 - R_1}{R_1(t_2 - t_1)}$$

where $R_2$ and $R_1$ are the resistance values of a single resistor at temperatures $t_2$ and $t_1$ respectively. The TCR may be either positive or negative.

The differences in the TCR's of the resistors comprising the network, or the TCR tracking, have a most significant effect on ratio stability. In a two resistor network, if the TCR of both resistors comprising the network are identical, the ratio of the two will remain constant as the ambient temperature changes. If the TCR's of the two resistors are not the same, as is usually the case, the ratio due to TCR effects will change as the ambient temperature changes. While TCR's may be either positive or negative, which means that the resistance may either increase or decrease with increasing temperature, the greater the difference in the TCR's of the two resistors, the greater will be the change in the ratio or the poorer will be the ratio stability.

In considering the affect of factor 2, VCR is defined as:

$$VCR = \frac{R_2 - R_1}{R_1(E_2 - E_1)}$$

where: $R_2$ and $R_1$ are the resistance values of a single resistor at applied voltages $E_2$ and $E_1$ respectively.

The VCR of deposited film resistors is always negative, and for well designed, properly manufactured, thin film resistors, the VCR is generally quite low. For example, thin film resistors made from 100 to 200 ohms per square material, typically have VCR's in the range of 0.001 to 0.01 ppm/volt. Hence, a 10 megohm resistor will decrease in ohmic value by 1 to 10 ppm (10 to 100 ohms) when the voltage applied to it is increased 1,000 VDC (e.g. from 100 V to 1100 V).

When considering resistive divider networks, the voltage change is in proportion to the resistor values. Hence, for dividers with ratios greater than 10 to 1, only the VCR of the higher value resistor is significant.

Time wise, the effect of VCR on the absolute value of a film resistor is essentially instantaneous while the effect of TCR on the absolute value of a film resistor depends on the thermal time constant of the resistor. Typically 90% of the temperature rise is complete in less than one minute. The combined effect of VCR and TCR on the resistor value is called power coefficient of resistance or PCR, and is the algebraic sum of the change in resistance of a resistive element due to its VCR and an increase in applied voltage (always negative) and the change in resistance of the same resistive element due to its TCR and the self heating caused by the same increase in applied voltage (may be either positive or negative). The combined effect (PCR) can cause the resistor value to either increase, decrease, or in rare cases, even remain constant.

In considering the affect of factor 3, the relative temperature of the two resistors depends upon three parameters:

1. the power dissipated per unit area by each resistor;
2. the distance between the two resistors; and
3. the thermal conductivity of the substrate.

Consider first parameter number 1, the power dissipation per unit area. The power dissipated by each resistor in the network is a given and is directly proportional to the ohmic value of each resistor. If the area of the network was infinitely large, the temperature rise of all sections, and hence the temperature difference between sections, would be essentially zero. If the area of the network was infinitely small, the temperature rise would be very high, but because all the resistors occupied the same space, there would be no temperature difference between sections. Obviously both cases are impractical, but serve as theoretical boundaries. Actual networks probably average $\frac{1}{4}'' \times 1'' \times .025''$ thick with the individual resistive elements placed side-by-side on the substrate. The higher the total power dissipated and the greater the difference in power dissipated by the individual resistors, the greater will be the difference in temperature between the resistors.

Skipping parameter 2 for a moment, consider parameter number 3 next—the thermal conductivity of the substrate. The conductivity of most materials in common use today—steatite, glass, alumina, etc. is relatively poor compared to copper. Hence, there will always be a difference in average temperature of high and low dissipative sections.

This leaves only parameter number 2, the distance between the resistors on the substrate. Unfortunately, regardless of how close together the resistors are placed in the conventional side-by-side configuration, there will always be a difference in the average temperature of high and low power dissipative sections; this again coming back to the imperfect thermal conductivity of the substrate.

Hence, even if the TCR's of the two resistors are identical, the ratios will still change when the applied voltage is increased (unless the TCR of each resistor is zero, which is virtually impossible). Further, regardless of the method used to deposit the resistive material on the substrate, there is always some random variation in the metallurgy of the film. Hence, the TCR of the resulting metal film, from one edge of the substrate to the opposite edge tends to vary smoothly, although not necessarily linearly, with distance from the reference edge. Hence, it is virtually impossible to have resistors with identical TCR's.

There has been a long felt need for a film resistor divider network where the TCR difference of the individual resistors approaches zero over the operational temperature range and the temperature difference of the individual resistors approaches zero over the operational voltage range.

SUMMARY OF THE INVENTION

An advantage of the present invention is to provide a resistive divider network wherein the TCR difference of the individual resistors approaches zero over the operational temperature range and the temperature difference of the individual resistors approaches zero over the operational voltage range.

In the present invention, each of the elements of the resistive dividers are formed into a plurality of subelements spaced across the substrate and interconnected to form discrete resistor elements. The subelements of the resistive element dissipating the lower power are interleaved between the subelements of the resistive element dissipating the higher power. By having a provision for resistive trimming of each subelement, it is possbile to obtain desired absolute values and ratios.

The present invention further provides an improved resistor divider network having an improvement in TCR tracking typically in excess of 1,000%.

The above and additional advantages of the present invention will become apparent to those skilled in the art from a reading of the following detailed description when taken in conjunction with the accompanying drawings.

DESCRIPTION OF THE PREFERRED EMBODIMENT

Figure 1:
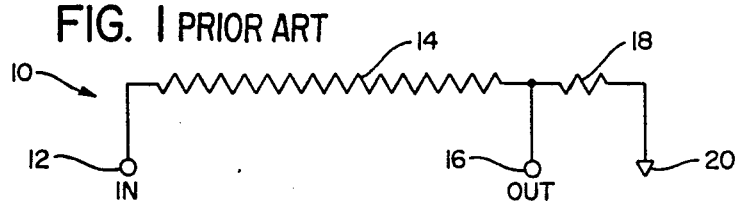
FIG. 1 is the electrical circuit schematic representing a typical two resistor divider network.

Referring now to FIG. 1, therein is shown a schematic representation of a resistor divider network 10. The network 10 has an input terminal 12 connectible to a first resistive element 14. The first resistive element 14 is connectible to an output terminal 16 and to a second resistive element 18 which is connectible in turn to a ground terminal 20.

As would be evident to those skilled in the art, the terminals are referred to for clarity only since divider networks may be integral with other circuit components and thus may not have terminals. Similarly, the input, output, and ground terminology is for clarity only since multiple resistor networks could have multiple inputs, outputs, and grounds. Further, the elements are considered "connectible" because they may not be connected to a terminal when manufactured as a complete network; it is possible that all connections may be made apart from the network itself.

In precision resistive dividers, it is often necessary that (1) the resistance ratios change by no more than 0.5 ppm/°C. over the operating temperature range, and (2) by no more than 2.0 ppm over the operating voltage range. In the past, such stringent requirements could only be met through the use of several carefully matched, wirewound resistors which were very expensive and physically quite large.

Figure 2:
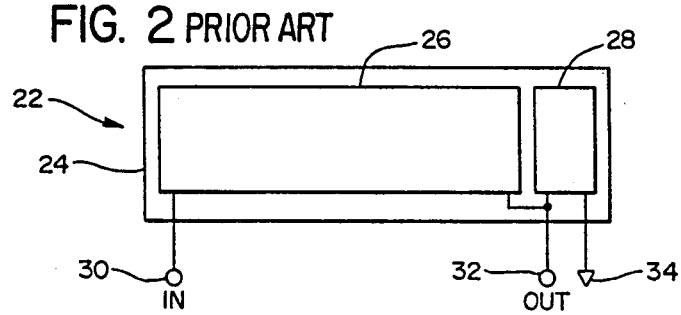
FIG. 2 is a plan view of a prior art resistor divider network.

Referring now to FIG. 2, therein is shown a prior art, film resistive divider network which had resistance ratio stability adquate for some, but not all, applications formerly requiring wirewound resistors.

The film resistor 22 includes a substrate 24. The substrate 24 could be glass or other material but is by preference alumina ($Al_2O_3$) with a thermal conductivity about 5% that of copper. Typically, it is $\frac{3}{4}''$ long by $\frac{1}{2}''$ wide and 0.025" thick.

Deposited on the substrate 24 by sputtering, vacuum deposition or other means is a resistive material which in subsequent manufacturing operations is coated with a photoresistive material, photo masked, exposed to ultra violet light, then chemically etched to remove the unwanted material leaving the desired resistive elements 26 and 28 in a serpentine pattern which may be so fine as to be considered rectangular as a whole to a viewer. The serpentine pattern conventionally also includes shunts which are vaporized away with a laser during a "laser trimming" operation to establish the exact resistance and ratio values, as well known to those skilled in the art. The resistive material almost universally used is Nichrome (a registered trademark of Driver Harris Company) alloy which contains 60% nickel, 24% iron, 16% chromium, and 0.1% carbon. Due to variations in metallurgy of the film deposited onto the substrate, the TCR of the resulting metal film varies from one edge of the substrate to the opposite edge. The TCR tends to vary smoothly, although not necessarily linearly, with distance across the substrate. The first resistive element 26 is the higher power dissipating element of the two.

The first resistive element 26 is connectible to an input terminal 30 and to an input terminal 32 which is also connectible to the second resistive element 28. The second resistive element 28 is further connectible to a ground terminal 34.

While the efficiency of heat transfer between the two resistive elements 26 and 28 increases as the size of the elements decrease and the space between them decreases, there is a limit on size imposed by a number of factors.

Figure 3:
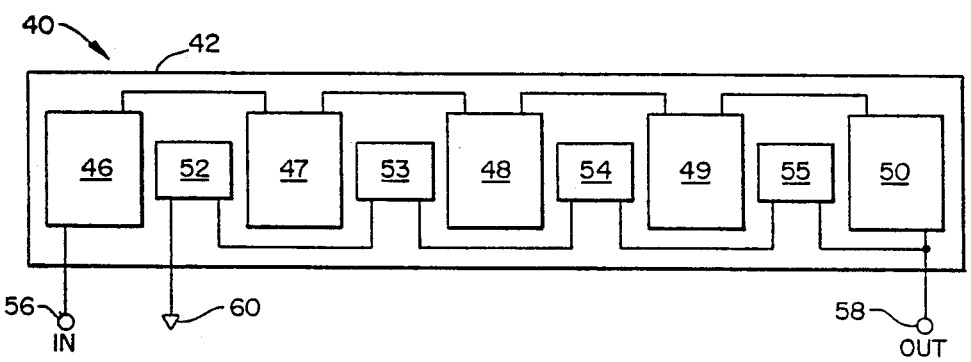
FIG. 3 is a plan view of the resistor divider network of the present invention.

Referring now to FIG. 3, therein is shown an improved resistor divider network 40. The network 40 is disposed on a substrate 42. The substrate 42, compared to a conventional similar resistor divider network, is somewhat larger being $1\frac{1}{2}''$ long by $\frac{5}{8}''$ wide and 0.025" thick. Deposited on the substrate 42 is a resistive material which is divided up into a number of portions. One portion defines a first resistive element which is made up of first resistive subelements 46 through 50. Interleaved between the first resistive subelements 46 through 50 is a second resistive element which is made up of second resistive subelements 52 through 55. As seen in the Figure, the subelements 52-55 of the second resistive element are substantially equidistantly disposed between the subelements 46-50 of the first resistive element.

The first resistive subelements 46 through 50 are interconnected to form the equivalent of the first resistive element 26 of FIG. 2 and, similarly, the second resistive subelements 52 through 55 are interconnected to form the equivalent of the second resistive element 28 of FIG. 2.

The first resistive subelement 46 on one side of the substrate is connectible to an input terminal 56 and the last resistive subelement 50 on the other side is connectible to an output terminal 58. The first resistive subelement 52 on one side is connectible to a ground terminal 60 while the last resistive subelement 55 is connectible to the output terminal 58.

By comparing the resistor divider networks of FIG. 2 and FIG. 3, it may be seen that substantial improvement in resistive ratio stability can be achieved just in the TCR tracking.

For example, assume that the TCR of the resistive material varies from 10.00 ppm/°C. at the left edge of the substrate to 6.00 ppm/°C. at the right edge of the substrate for both FIGS. 2 and 3.

For the network 22, the approximate TCR of the right hand edge of element 26 will be 6.50 ppm/°C. It becomes apparent then that the average TCR for the resistive element 26 is (10.00+6.50)/2 or 8.25 ppm/°C. With the left side of the second resistive element 28 approximately 6.40 ppm/°C. the average TCR of the second resistive element 28 is (6.40+6.00)/2 or 6.20 ppm/°C. It then becomes apparent that the difference between the TCR's, or TCR tracking, is (8.25-6.20) or 2.05 ppm/°C.

Looking at the improved divider network 40, and assuming a nonlinear but always decreasing TCR as we move from left to right, the average TCR's for the various resistive subelements of the first resistive element typically might be: 10.00 for subelement 46; 8.50 for subelement 47; 8.00 for subelement 48; 7.00 for subelement 49; and 6.20 for subelement 50. The average TCR for the first resistive element would then be (10.00+8.50+8.00+7.00+6.20)/5 or 7.94 ppm/°C. For the second resistive element, the interpolated volues of TCR's of the subelements would be 9.25 for subelement 52; 8.25 for subelement 53; 7.50 for subelement 54; and 6.60 for subelement 55. Thus, the average TCR for the second resistive element would be (9.25+8.25+7.50+6.60)/4 or 7.90 ppm/°C. The difference between the average TCR's for the resistor network 40 or TCR tracking would then be (7.94-7.90) or 0.04 ppm/°C.

The improvement in TCR tracking of the new, interleaved design over the old prior art design is 2.05 ppm/°C.÷0.04 ppm/°C.=51 to 1. Thus, the preferred embodiment shows approximately a 5,100% improvement.

In reviewing the above, it become evident that as the number of subelements increases, the ratio TC improves, approaching 0. Further, if the variation in TCR is linear from one side of the substrate to the other, the TC tracking of a two resistor divider will always be perfect (zero), regardless of the number of subelements used, providing that the total number is always an odd number.

Still further, it is evident that the prior art suffers from uneven temperature distribution across the resistive elements because temperature is a direct function of the power dissipated per unit area by each resistive element. By interleaving subelements of the high and low power dissipative elements and by placing the subelements of the resistive element dissipating the higher power at the sides of the substrate so that they effectively surround the subelements of the resistive element dissipating the lower power, a much more uniform temperature may be achieved across the substrate.

In order to evaluate the present invention, 17 samples of a divide-by-64 (64:1), thin film resistor network were fabricated using a sputtered Nichrome film on a high purity alumina substrate.

The five subelements 46 through 50 were laser trimmed to be of approximate equal value and the subelements 52 through 55 were also trimmed to be of approximate equal value. Accordingly, the subelements 46 through 50 dissipate substantially equal quantities of power in response to application of a voltage thereto. The total resistance of the subelements 46 through 50 was 9.84500 megohm±0.1%. The total resistance of the subelements 52 through 55 was 0.15619 megohm±0.1%. The nominal division ratio was 9.84500+0.15619/0.15619=64/1 (i.e. 64:1) Through software instructions, a computer controlled laser trimmer brought this ratio to within ±0.05% of nominal.

The TCR's of the two sets of subelements were tested over the temperature range of 18° C. to 58° C. and the difference tabulated for each network. The absolute TCR's ranged from approximately 1 ppm/°C. to 6 ppm/°C., and the ratio TCR's ranged from 0.02 ppm/°C. to 0.30 ppm/°C. with an average of 0.12 ppm/°C. which was four times better than the target goal of 0.50 ppm/°C.

The PCR's (power coefficient of ratio) ranged from 0.09 ppm to 0.44 ppm for a 1000 volt change in input voltage (100 volts to 1100 volts). The average ratio PC was 0.27 ppm which was eight times better than the target goal of 2.0 ppm.

By comparison, typical performance figures for prior art network 22 would be TC tracking of 2 ppm and PC of ratio of 10 ppm.

As many possible embodiments may be made from the present invention without departing from the scope thereof, it is to be understood that all matters set forth herein are shown in the accompanying drawings as to be interpreted in an illustrative and not a limiting sense.

What is claimed is:

1. A symmetric arrangement for providing substantially uniform temperature coefficient of resistance to a plurality of film resistors in a network formed on a substrate, comprising:
   a substrate;
   a resistive material on said substrate; and
   a plurality of separate portions of said resistive material forming each of said resistors, wherein
   said plurality of resistive portions are symmetrically arranged with respect to one another relative to an axis of symmetry along said substrate, thereby providing said substantially uniform temperature coefficient of resistance to said plurality of film resistors in said network.

2. A symmetrically arranged resistive network as recited in claim 1 wherein said plurality of separate portions forming each of said plurality of film resistors of said network are interconnected by connecting means provided therebetween.

3. A symmetrically arranged resistive network as recited in claim 1 wherein one of said separate portions forming one of said plurality of film resistors is located at said axis of symmetry.

4. A symmetrically arranged resistive network as recited in claim 3 wherein:
said one of said plurality of film resistors includes a plurality of connected ones of said separate portions of resistive material, and
further including at least two additional portions of resistive material symmetrically disposed relative to said axis of symmetry and interconnected by connecting means to form another of said film resistors of said network.

5. A symmetrically arranged resistive network for providing substantially uniform temperature coefficient of resistance to a plurality of film resistors in a network formed on a substrate, comprising:
a substrate;
resistive material on said substrate; and
a plurality of resistive portions forming said resistors, wherein
said plurality of resistive portions are symmetrically arranged with respect to one another relative to an axis of symmetry along said substrate,
one of said resistive portions forming one of said plurality of film resistors is located at said axis of symmetry,
said one of said plurality of film resistors includes a plurality of connected resistive portions, and
further including at least two additional resistive portions symmetrically disposed relative to said axis of symmetry and interconnected by connecting means to form another of said film resistors of said network, wherein
said additional resistive portions are interleaved with said plurality of resistive portions forming said one of said plurality of film resistors.

6. A symmetrically arranged resistive network as recited in claim 1 wherein symmetrically disposed ones of said separate portions of resistive material have substantially equal resistances, thereby providing said substantially uniform temperature coefficient of resistance to said plurality of film resistors in said network.

7. A symmetrically arranged resistive network as recited in claim 1 wherein said portions of resistive material include laser trim section means for trimming said portions to provide substantially equal resistance values to corresponding symmetrically disposed resistive portions of one of said film resistors.

8. A symmetric arrangement for providing substantially uniform temperature coefficient of resistance to a plurality of film resistors in a network formed on a substrate, comprising:
a substrate;
a resistive material on said substrate; and
at least one of said film resistors formed as a distributed resistor including a plurality of interconnected portions of said resistive material distributed along said substrate, wherein
said plurality of resistive portions are symmetrically arranged with respect to one another relative to an axis of symmetry along said substrate,
thereby providing said substantially uniform temperature coefficient of resistance to said plurality of film resistors in said network.

9. A symmetric arrangement of resistive portions as recited in claim 8, wherein a second of said plurality of film resistors comprises a plurality of separate portions of said resistive material,
said portions of resistive material forming said second film resistor being interleaved with said plurality of separate portions forming said one of said plurality of film resistors.

* * * * *